SIGNAL SENSITIVE GATING CIRCUIT CONTROLLED BY A SIGNAL-OPERATED SWITCH HAVING DIFFERENT THRESHOLD LEVELS FOR TURN OFF AND TURN ON

Filed March 7, 1960 2 Sheets-Sheet 1

INVENTORS
WARD S. FLESHMAN, JR.
& RICHARD W. BRADMILLER
BY
Hurvitz & Rose
Alden D. Redfield
ATTORNEYS INVENTORS
WARD S. FLESHMAN, JR.
& RICHARD W. BRADMILLER
BY
Hurwitz & Rose
Alden D. Redfield
ATTORNEYS United States Patent Office 3,166,678

Patented Jan. 19, 1965

3,166,678

SIGNAL-SENSITIVE GATING CIRCUIT CONTROLLED BY A SIGNAL-OPERATED SWITCH HAVING DIFFERENT THRESHOLD LEVELS FOR TURN OFF AND TURN ON

Ward S. Fleshman, Jr., Cincinnati, Ohio, and Richard W. Bradmiller, Winter Park, Fla., assignors to Avco Corporation, Cincinnati, Ohio, a corporation of Delaware Filed Mar. 7, 1960, Ser. No. 13,143

5 Claims. (Cl. 307—88.5)

The present invention relates generally to gating and filter circuits, and more particularly to gating circuits incorporating a regenerative switch in one of dual signal paths, to effect distortionless high speed switching of signals in the other path, and to semi-active electrical filters incorporating such gating circuits.

Briefly describing a first embodiment of the present invention, an input signal is presented to two parallel channels. In one of the channels is provided a peak detector in cascade with a monostable switch, the output of the latter gating on a normally closed gate amplifier. The other channel presents the original signal to the gate amplifier for gating thereby through the amplifier, when, and only when, the monostable switch turns on the gate amplifier in response to a predetermined threshold value of input signal. The peak detector provides a D.C. output which is proportional to the peak value of the input signal. When the D.C. output attains a predetermined threshold level the monostable switch transfers its operative condition regeneratively from one of conduction in a first stage to one of conduction in a second stage, returning conduction to the first stage only when the D.C. control voltage falls below a second predetermined threshold level. The monostable switch, when the second stage becomes conductive, opens the normally closed gate amplifier, passing the input signal to an output lead.

It is an important feature of the invention that a greater signal is required to condition the monostable switch in the state in which the second stage is conductive than is required to return the system to quiescent condition. As peak input signal level increases, therefore, the on gating thershold value is relatively great, whereas for decreasing signal level the off gating threshold value is relatively small. This characteristic is very desirable since it prevents the system from randomly switching on and off in response to signals which are very close to the on gating threshold level, or to the off gating value. The system tends to stay in either its on gated or off gated condition, unless a considerable amplitude change in input signal takes place to reverse the condition of the gate.

The gating circuit of the present invention may be provided with a filter antecedent to the peak detector. Either the input of the filter or the output of the filter may be applied to the gate amplifier, but different operating characteristics are obtained for the different filter locations. The filter itself may be of any type, and may be active, i.e., may incorporate amplification to further emphasize a desired band. Only the output of the filter is applied to the peak detector, in both circuit configurations. A filtering system so constructed eliminates undesired frequency responses of the filter, i.e., ringing effects, as well as the undesired off channel portions of the frequency spectrum. The filter employed may be a passive filter, of any desired type, including band pass, band rejection, low pass or high pass, and the filters may be of conventional character, per se. Obviously, active filters may be employed in place of passive filters, if desired.

It is a significant property of a semi-active filter system of the type hereinabove described, in one of its embodiments, that the output signal has not passed through the filter, the latter being employed only to control development of a gating signal. The phase shift of the gated signal, introduced by the gating amplifier, will be approximately 0° or 180°, depending on the number of phase reversing stages incorporated in the gate amplifier. The amplitude response characteristic of the system is that of a filter with sharp skirts, since the gate amplifier is turned on practically instantaneously when the input signal appears, so long as the input signal is of sufficient amplitude to attain threshold value. The threshold value can be set to be attained only for frequencies falling within predetermined response points of a band-pass filter, for example, these points being well up on the skirts of the band pass gain versus frequency characteristic of the selector system. The response of the system to a signal of greater than threshold amplitude and simple periodic wave shape can be restricted by means of the pre-selector filter and the threshold level to precisely the pass band within specified frequency limits. The response will be essentially zero above and below this band.

The signal applied to the gate amplifier may be derived, according to a modification of the present system, from the output of the filter instead of from the input. This circuit difference gives rise to a fundamental difference of operation, in the presence of signals including harmonics of the response frequency of the filter. Assuming a band-pass filter and a source of signals including a fundamental at the frequency of the filter and harmonics of that frequency, and that the input signal is applied directly to the gate amplifier, rather than via the filter, the harmonics will be passed to the output circuit whenever the filter adequately responds to the fundamental of the input signal, despite the fact that the filter is not responsive to the harmonics.

On the other hand, if the output of the filter is applied to the gate amplifier the harmonic frequencies will appear proportionately attenuated in the output, i.e., the semi-active filter characteristics will be the same as those of the passive filter, within the pass-band of the semi-active filter.

In respect to ringing or auxiliary responses of the semi-active filter, when the input to the gate amplifier derives directly from the input proper, and not via the passive filter, such responses do not appear at the output of the system, regardless of the threshold level of the system, since such responses are not present in the input signal to the system. When the input to the gate amplifier is applied via the passive filter, however, auxiliary responses do not appear at the output provided the threshold level is set sufficiently high, i.e., above the level at which the auxiliary responses occur.

It is, accordingly, a broad object of the present invention to provide a circuit having a simple, fast, positive threshold action in response to A.C. signal over a wide frequency range.

It is a further object of the invention to provide a gating circuit incorporating a regenerative switch having a turn on threshold at a higher level than its turn off threshold, thereby eliminating random turning on and off in response to barely acceptable signals.

It is still another object of the invention to provide a dual channel gating system, one channel of which conveys an A.C. signal to an output path via a gate amplifier, and the other channel of which developes a gate on signal for the gate amplifier in response to predetermined peak values of the A.C. signal.

It is still another object of the invention to provide a novel gating circuit having the properties of a semi-active filter.

It is a further object of the invention to provide a semi-active filter having a bandwidth which is a direct function of the amplitude of an applied signal.

It is another object of the invention to provide a filter in which ringing responses of the filter are automatically eliminated at the output of the filter.

A further object of the invention is to provide a filter having solely a single predetermined phase shift response for all frequencies within the pass band of the filter.

Still a further object of the invention is to provide a semi-active filter having sharp skirts and an amplitude threshold.

A further object of the invention resides in the provision of a filter allowing response in a frequency band to signals of greater than a predetermined amplitude and having essentially zero response elsewhere.

Another object of the invention resides in the provision of a gating circuit incorporating a regenerative switch, to assure that once switching is started it will go to completion without an increase in drive.

A further object of the invention resides in the provision of a threshold circuit which can be remotely controlled by an applied A.C. signal.

Still another object of the invention is to provide a threshold circuit which is automatically controlled by the applied A.C. signal level.

It is a further object of the invention to provide a semi-active electrical filter, in which threshold action is obtained along with filter action.

The above and still further objects, features and advantages of the present invention will become apparent upon consideration of the following detailed description of several specific embodiments of the invention, especially when taken in conjunction with the accompanying drawings, wherein.

Figure 1:
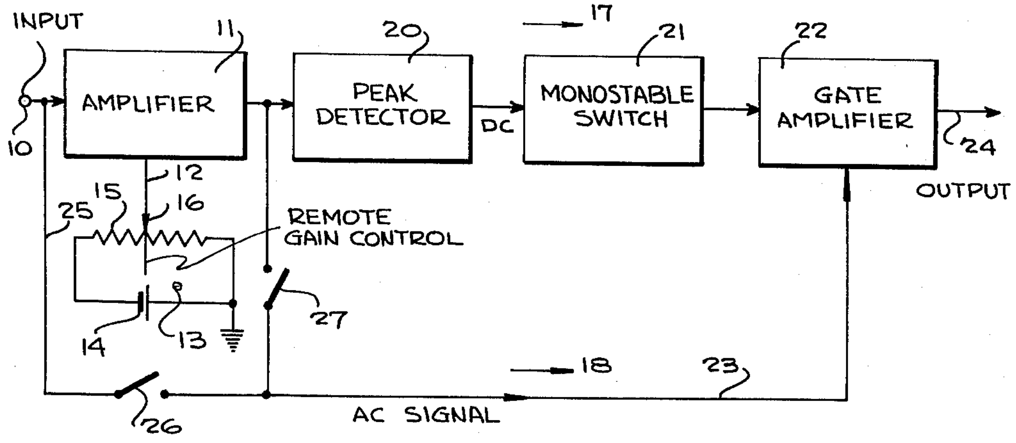
FIGURE 1 is a block diagram of a threshold circuit according to the invention.

Referring now to the accompanying drawings, the reference numberal 10 identifies a terminal to which may be applied an A.C. input signal. While the input wave form may be a sine wave, the system will function with other wave forms of period duration compatible with the time limitations imposed by the circuit. The terminal 10 is connected in cascade with an amplifier 11, to which may be remotely applied a gain control voltage, via lead 12, deriving from an adjustable D.C. voltage source 13. The latter may be of any desired character, per se, but in simple form may comprise a battery 14 in series with a potentiometer 15 having a variable tap 16 connected to lead 12.

Connected in cascade with the amplifier 11 is a pair of channels 17, 18, in parallel. The channel 17 comprises in cascade a peak detector 20, a monostable switch 21 and a gate amplifier 22. The channel 18 may comprise a lead 23 which provides signal input to the gate amplifier 22 for gating thereby. An output path 24 is connected to the gate amplifier 22. The lead 23 may, if desired, include provision for signal amplification or attenuation, or for processing the A.C. signal conveyed thereover in other respects, as by filtering, phase shifting, modulating and the like. A circuit 25 is provided from the terminal 10 directly to the lead 23, which may be closed by a switch 26, the output of amplifier 11 being simultaneously disconnected from lead 23 by switch 27.

In operation, the amplifier 11 may be utilized to amplify the A.C. signal provided at terminal 10 to a suitable level for application to peak detector 20, as necessary. The amplifier 11 also permits the threshold level of the system, including the amplifier, to be remotely controlled, by controlling amplifier gain. The signal level at the output lead 24 may be independent of the gain of amplifier 11, when switch 26 is closed and switch 27 open, or may be dependent on the gain of amplifier 11, when switch 27 is closed and switch 26 open. With both switches closed the amplifier 11 is by-passed.

The peak detector 20 detects the peak value of A.C. signal available at its input and in response to the latter generates a D.C. output signal, which actuates the monostable switch 21 into a state such that it provides an on gating signal to gate amplifier 22, provided the D.C. output signal attains the threshold level. When the A.C. signal decreases in amplitude sufficiently below the threshold level, on the other hand, the monostable switch 21 reverts to a condition in which it removes the on gate control signal at gate amplifier 22, which is equivalent to providing an off gate control signal. The on gate threshold level is arranged to be materially above the off gate threshold level, so that the conductive condition of the gate amplifier 22, whatever it may be, will not change for a small change in level of input signal.

When the gate amplifier is gated on, signal directly from terminal 10 or from the output of amplifier 11, depending on the operative conditions of switches 26, 27, is amplified by the gated amplifier and passed to the output lead 24.

Figure 2:
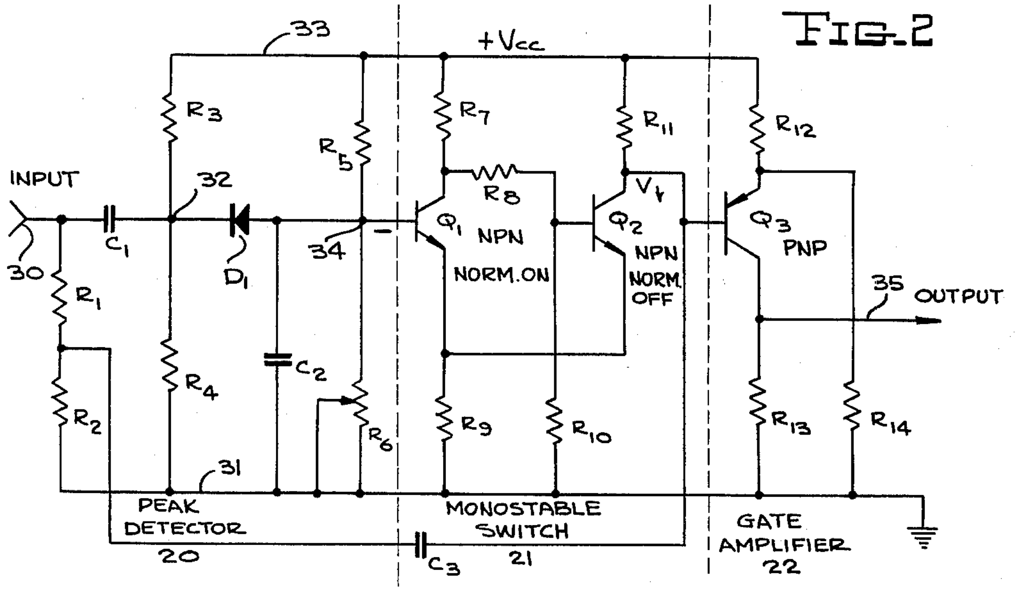
FIGURE 2 is a schematic circuit diagram of the threshold circuit of FIGURE 1.

Referring now more particularly to FIGURE 2 of the drawings, A.C. signal is applied to an input lead 30 of peak detector 20, and is developed across series resistances $R_1$, $R_2$ to a ground lead 31. The terminal 30 is coupled via a coupling capacitor $C_1$ to a terminal 32. From the terminal 32 to a positive voltage supply lead 33 is connected a resistance $R_3$, a resistance $R_4$ being connected between terminal 32 and ground. A diode $D_1$ has its cathode connected to terminal 32 and its anode to ground lead 31 via a storage capacitor $C_2$. The anode of diode $D_1$ is connected to the junction 34 of resistances $R_5$ and $R_6$, the latter being variable, and which extend between positive voltage lead 33 and ground, in series.

The elements $R_3$, $R_4$, $D_1$, $C_2$, $R_5$, $R_6$ constitute a peak detector, developing at junction 34, a D.C. potential representing the average voltage developed across $C_2$. This voltage serves also as a back bias on diode $D_1$ limiting the detection area. The purpose of the peak detector is to establish a "running" bias on transistor $Q_1$. The voltage generated may be considered, for analytical purposes, similar to the theory developed for the grid leak type detector. The time constant is determined by the value of $C_2$ and the resultant value of resistance in branches comprising $R_3$, $R_4$, $R_5$, $R_6$ and $Q_1$ base-emitter and base-collector circuits. The value $R_6$ is a controlling parameter made variable to set the threshold operating levels for the system. $R_6$ can be or include a current sensitive device, e.g., a thermistor, varistor or the like, to control the difference between gate-on and gate-off points automatically. Upon the application of an A.C. signal of predetermined magnitude, the semiconductor diode $D_1$, which is in a state of slight forward conduction, is driven into heavy conduction, thereby rapidly discharging the voltage stored in capacitor $C_2$ and effectively reversing the voltage bias on the base of transistor $Q_1$. This action serves to rapidly change the state of transistor $Q_1$. It will be seen that to return transistor $Q_1$ to its original state, the A.C. signal will have to be reduced to some level considerably lower than that required to change its state originally since the impedance in the base input circuit of transistor $Q_1$ is low during periods of conduction of the diode $D_1$.

The monostable switch 21 of the system employs two transistors $Q_1$ and $Q_2$, both of NPN type, and each including at least the usual collector, base and emitter.

The base of transistor $Q_1$ is directly connected to junction 34. The resistors $R_5$ and $R_6$ function in connection with $R_3$ and $R_4$ to establish the initial bias on diode detector $D_1$. The anode potential of $D_1$ must be compatible with the desired quiescent conditions of $Q_1$, in this case, described as the state of conduction. This condition is arrived at by adjusting $R_6$. The collector of transistor $Q_1$ is connected to voltage supply lead 33 via resistance $R_7$, and the emitter to the ground lead 31 via resistance $R_9$.

The collector of the transistor $Q_2$ is connected to the voltage supply lead 33 via a resistance $R_{11}$, and the emitter to ground lead 31 via resistance $R_9$, i.e., the emitters of transistors $Q_1$ and $Q_2$ are directly connected together. The base of transistor $Q_2$ is connected to the collector of transistor $Q_1$ via resistance $R_8$ and to the ground lead 31 via resistance $R_{10}$.

The transistor $Q_1$ is quiescently in conductive state. In response to A.C. signal at terminal 30 the potential at junction 34 decreases, since the peak detector comprising diode $D_1$ develops a negative voltage. If the detected D.C. voltage makes the base voltage of transistor $Q_1$ less positive than the emitter voltage, $Q_1$ is switched into non-conductive condition, raising the voltage at the base of transistor $Q_2$, and rendering the latter conductive. This reduces the voltage at the collector of $Q_2$, and raises the voltage at the emitter of transistor $Q_1$, which confirms its non-conductive state.

The gate amplifier 22 of the system comprises a PNP transistor $Q_3$, having an emitter connected to supply lead 33 via a resistance $R_{12}$, and to ground lead 31 via resistance $R_{14}$, and a collector connected to ground lead 31 via a resistance $R_{13}$. An output lead 35 is connected directly to the collector of transistor $Q_3$. The base of transistor $Q_3$ is connected directly to the collector of transistor $Q_2$. The base of collector $Q_3$ is also connected via a blocking capacitor $C_3$ to the junction of resistance $R_1$ and $R_2$. An A.C. signal path therefore exists from input terminal 30 to the base of transistor $Q_3$ via capacitor $C_3$, the transistor $Q_3$ transferring the signal to output lead 35 when conductive, and blocking the signal when non-conductive.

Transistor $Q_3$ is quiescently turned off, its base being at a higher potential than its emitter. When transistor $Q_2$ becomes conductive, the base of transistor $Q_3$ is reduced in potential, which turns transistor $Q_3$ on. The quiescent emitter potential of transistor $Q_3$ is established by the relative values of resistances $R_{12}$ and $R_{14}$, which constitute a voltage divider. This voltage divider may consist of a resistor and a voltage regulating diode, or a voltage regulating device may be included in the voltage divider, if desired. The potential of the base of transistor $Q_3$ is essentially that of the voltage supply lead 33 when transistor $Q_2$ is non-conductive, i.e., in quiescent condition. The values of $R_{12}$ and $R_{14}$ are selected to assure that transistor $Q_3$ is non-conductive in this condition, i.e., that the emitter of transistor $Q_3$ is at relatively low potential. When transistor $Q_2$ becomes conductive, however, the potential of the base of transistor $Q_3$ drops, and the various potentials are selected such that the drop is adequate to gate transistor $Q_3$ on.

While the specific embodiment of our invention illustrated in FIGURE 2 employs NPN type transistors in the monostable switch, and a PNP unit for the gated amplifier, PNP units might have been employed for the switch, and an NPN unit for the gated amplifier. In such case, the polarity of the supply voltage must be reversed, and the diode $D_1$ reversed.

Figure 3:
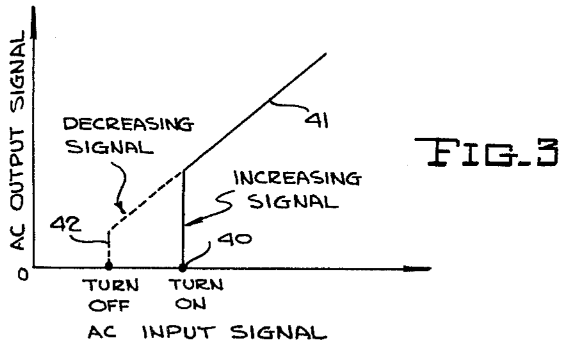
FIGURE 3 is a plot of the response characteristics of the gate circuitry of the systems of FIGURES 1 and 2.

Referring to FIGURE 3 of the accompanying drawings, the switching characteristics of the system are illustrated. As input A.C. signal amplitude increases a threshold level 40 is reached at which the switch reverses state, effecting a sudden output from the gated amplifier. The output of the latter then is a direct function of the A.C. signal input level, as indicated at 41. As A.C. signal amplitude decreases, however, the threshold level 40 must be passed to attain an off gate threshold, at 42, for which the gate amplifier becomes totally non-conductive. To accomplish this type of operation use is made of the driving point impedance characteristics of the monostable switch, the diode amplifier action of the junctions of transistor $Q_1$ and the bias control action of the peak detector circuitry. Both transistors $Q_1$ and $Q_2$ have the same characteristic driving point impedance, except that one is the reverse of the other; that is to say, while transistor $Q_1$ is in the "on" region from P to R and in the "off" region from Q to T, the transistor $Q_2$ will be in the "on" region from T to Q and in the "off" region from R to P. However, only transistor $Q_1$ is useful in controlling the threshold action of the system, and its operating characteristic is treated to better explain the overall action of the system.

Figure 4:
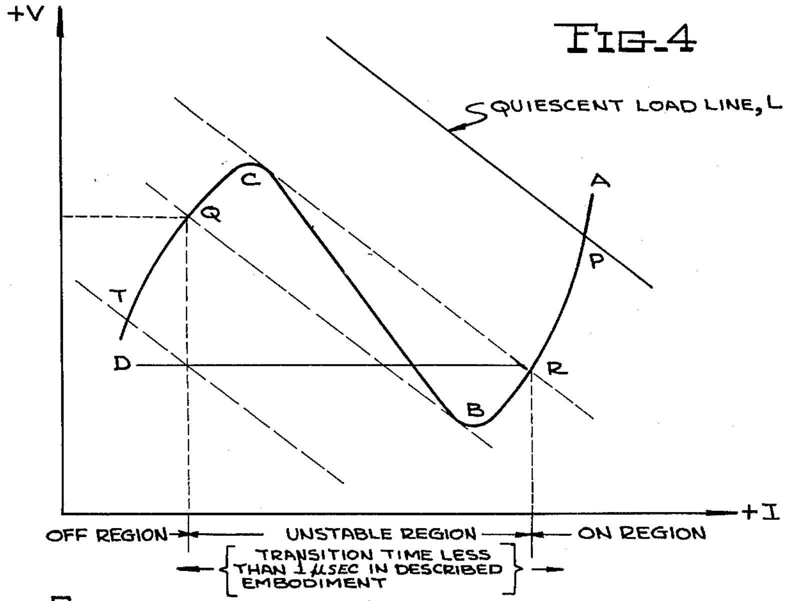
FIGURE 4 is a plot of a typical driving point impedance characteristic with superimposed load line for a monostable trigger circuit, incorporated in the system of FIGURE 2.

Referring to FIGURE 4 of the accompanying drawings, the curve A, B, C, D represents a plot of driving voltage versus driving current, as found at the base of the transisitor $Q_1$. This transistor is normally on, and is required to be turned off in response to a control signal.

Referring to FIGURE 4, it can be seen that transistor $Q_1$ has but two stable regions of operation where the slope of the curve is positive, i.e., between AR in the "on" region and between QD in the "off" region. That portion of the characteristic between Q and R represents an unstable condition of operation. The quiescent load line L represents the load resistance and the quiescent bias voltage connected to the base of transistor $Q_1$. To have stable operation this quiescent load line must intersect the characteristic curve ABCD only once in either stable region. The load line L, which is quiescent at P in the region of A to R, varies vertically without change of slope as the bias voltage on the base of transistor $Q_1$ is made less positive since its position represents bias and its slope represents resistance values. As the driving voltage is decreased, the load line eventually moves to intersect the section of the curve AB beyond R toward B and to touch the section of the curve CD at C. This represents an unstable condition as defined. And operating point R must be transferred suddenly beyond point Q to obtain stable operation in the "off" region as the driving voltage is further reduced. Transistor $Q_1$ is turned off when the load line intersects section CD beyond Q. The section of curve ABCD between Q and R represents unstable conditions of operation and an area of indecision where it may merely stutter.

The positive action realized from this system may be understood by tracing the transit of load line L from points P to T. Consider a steady decrease of the ordinate value from P to R and on toward B. While the section RB represents indecision, the voltage is steadily dropping, and at B the slope of the characteristic is reversed with an instant voltage reaction on the $Q_1$ base, as indicated by the relative levels of B and C. This surge momentarily results in high base current in $Q_1$ and a corresponding drop in its voltage at the base with respect to the emitter. That action snaps the load line to some point well beyond T, blocking conduction through $Q_1$. The surge through the base-emitter diode instantly reverses the base-emitter bias of $Q_1$. Biases are quickly stabilized, but now at some point T (the diode amplifier action may be studied by reference to "Handbook of Semi-Conductor Electronics" by L. P. Hunter, pages 15–49) a further increase of signal input will only serve to move the load line below T toward zero in the stable region.

The quiescent load line L, when transferred for the condition of transistor $Q_1$ in the "off" region, i.e., for a strong signal input, will normally be biased to some position below T. If the bias is again made more positive, the quiescent load line L moves up until it contacts section AB at B and further increase of driving voltage eventually will drive it to some point beyond R for stable operation, such as point P, depending on preset conditions. The action in this instance is essentially the reverse of the cut-off switching. The differences in the quiescent points P and T represent the difference in threshold gate-on and gate-off levels.

It follows that turn off requires more positive base voltage than does turn on. The actual bias of the circuit of FIGURE 3 is compounded of a fixed positive bias, to which is added a negative control voltage derived by peak detector $D_1$ from the applied A.C. signal. Therefore, to turn off the circuit once it has been turned on, the A.C. signal level must drop below the turn on value.

The difference in turn on and turn off thresholds are adjusted by selection of quiescent operating point P. This can be varied by controlling $R_6$, but the actual value is dependent primarily on the pre-bias of diode $D_1$, which is provided by voltage dividers $R_3$ and $R_4$ and the network containing $R_5$, $R_6$ and the associated $Q_1$ transistor circuitry. Adjusting $R_6$ provides a fine adjustment.

In a practical embodiment of the present invention, the following circuit parameters were employed, these parameters being illustrative only of one practical embodiment of the invention, and it not being intended that the invention shall be limited thereby.

| | |
|---|---|
| Resistor $R_1$ | 1K ohms. |
| Resistor $R_2$ | 100 ohms. |
| Resistor $R_3$ | 47K ohms. |
| Resistor $R_4$ | 10K ohms. |
| Resistor $R_5$ | 10K ohms. |
| Variable resistance $R_6$ | 5K ohms. |
| Resistor $R_7$ | 3.3K ohms. |
| Resistor $R_8$ | 10K ohms. |
| Resistor $R_9$ | 2.2K ohms. |
| Resistor $R_{10}$ | 4.7K ohms. |
| Resistor $R_{11}$ | 3.3K ohms. |
| Resistor $R_{12}$ | 470 ohms. |
| Resistor $R_{13}$ | 3.3K ohms. |
| Resistor $R_{14}$ | 3.9K ohms. |
| Capacitor $C_1$ | 6$\mu$f. |
| Capacitor $C_2$ | 20$\mu$f. |
| Capacitor $C_3$ | 6$\mu$f. |
| Transistor $Q_1$ | Type 903. |
| Transistor $Q_2$ | Type 903. |
| Transistor $Q_3$ | Type CK 791. |
| Diode $D_1$ | Type IN 538. |
| Supply Voltage | +24v. D.C. |

In the practical embodiment, the operating frequency was 2300 c.p.s. The wave shape was sinusoidal. The dynamic range of the system was 10 to 1 (20 db) with less than 1 percent distortion. The maximum input was 10 volts rms while the corresponding output was 0.240 volt R.M.S. The maximum threshold level (turn on) could be adjusted to 1.5 volts R.M.S. The corresponding turn off voltage was 0.4 volt R.M.S. lower. Both turn on and turn off times were less than one microsecond. The circuit was operative in the temperature range of −55° to +85° C. This particular application demanded good isolation from the input and required relatively low output. This was accomplished by dividing down the input approximately 100 to 1 and limiting the gain of the gate amplifier to approximately 10 db. The variation from a true 180° phase shift was negligible in this case.

Figure 5:
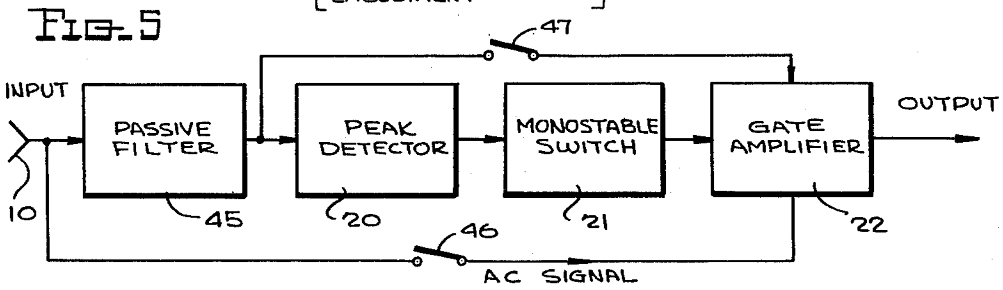
FIGURE 5 is a block diagram of a semi-active filter incorporating the gating circuit of FIGURES 1 and 2.

In accordance with a modification of the present invention, illustrated in FIGURE 5 of the drawings, a filter 45 is provided in cascade antecedent to the peak detector 20, the latter being followed by monostable switch 21 and gate amplifier 22, as in FIGURE 1. The input terminal 10 is connected to the input of passive filter 45, and either the input or the output of passive filter 45 may be applied, selectively, via switches 46, 47, to the gate amplifier 22 for controlled amplification and transmission therethrough. The filter 45 may be of any desired type, with consequent distinctions in the operation of the system, due to filter characteristics, which will be evident to those skilled in the art, in the light of the succeeding discussion based on the premise that filter 45 is a band-pass filter.

The system of FIGURE 5 is denominated herein a semi-active electrical filter, since the filtering action per se is based on a passive filter, and the active portion of the system supplements the action of the passive filter.

Figure 6:
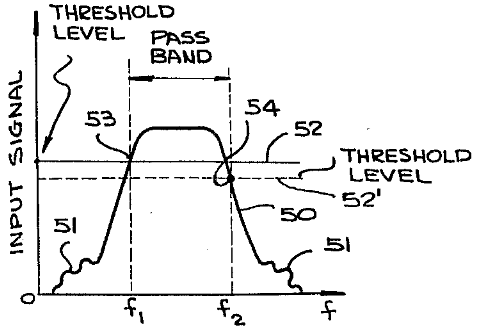
FIGURE 6 is a plot of the response of a conventional passive filter.

Referring to FIGURE 6, there is illustrated at 50 a typical band pass filter characteristic for a passive band pass filter 45. The response 50 of the filter 45 is shown to include auxiliary frequency responses 51, sometimes referred to as ringing effects. These occur normally at the edges of the pass band of a filter and are of relatively small amplitude, i.e., of the order of 10%. The on and off thresholds for the amplitude gating portion of the system are assumed to be 52, 52'.

Figure 7:
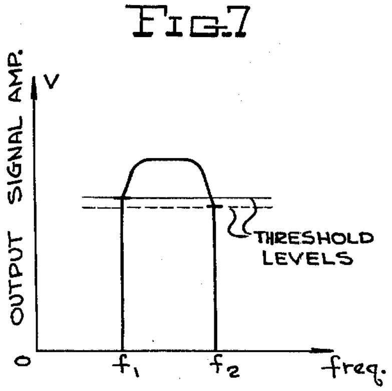
FIGURE 7 is a plot of the response of the semi-active filter of FIGURE 5.

The points of intersection of threshold levels 52 and 52' with the response of the filter 45 are at 53 and 54. It will then be evident that the system of FIGURE 5, due to its combined amplitude and frequency gating properties will have responses only between points 53 and 54, coresponding with frequencies $f_1$ and $f_2$. The response of the semi-active filter system of FIGURE 5 is, then, that illustrated in FIGURE 7 of the drawings, i.e., zero response except between frequencies $f_1$ and $f_2$. This type of response is ideal because off-channel attenuation is infinite, and it is further of importance that the filter 45 introduces no phase shift in the output of the system, for any frequency. Phase shift of the system is either 0° or 180°, depending on the characteristics of amplifier 22, i.e., the number of phase reversing stages contained therein.

The band pass of the system, i.e., the separation between frequencies $f_1$ and $f_2$, is a function of input signal amplitude, and also of threshold levels. For a defined bandwidth, therefore, defined levels must be employed and a constant amplitude signal must be applied to the filter. However, for any signal level, bandwidth may be readily varied by varying threshold levels, or as in the threshold system of FIGURE 1, by incorporating a variable gain device ahead of the peak detector 20.

If we assume that the input signal includes harmonics of a fundamental frequency for which the filter 45 is a pass filter, these will pass to the output with the fundamental frequency, although the peak detector is responsive to the fundamental frequency only, if switch 46 is closed and switch 47 is open (case 1). By opening switch 46 and closing switch 47 (case 2) the operation of the system may be modified to pass to the output lead only signals passed by the filter 45, and having the requisite amplitude. Ringing effects are eliminated at the output in either case, since these have amplitudes falling below the threshold level 52, for case (2), and since it is not the response of the filter but its input which appears at the output of the system for case (1).

While we have described and illustrated one specific embodiment of our invention, it will be clear that variations of the details of construction which are specifically illustrated and described may be resorted to without departing from the true spirit and scope of the invention as defined in the appended claims.

What we claim is:

1. The combination comprising: a source of alternating current signals; a gating circuit coupled to said source for passing said alternating current signals, said gating circuit comprising a transistor having an emitting electrode, a collecting electrode, and a current flow control electrode; a two-terminal direct current source of biasing potential; a resistive load for said signal connected to said collecting electrode, said resistive load and said collecting and emitting electrodes being connected in series between said terminals; an electronic filter having a pass-band characteristic having at least one skirt of predetermined finite slope, said alternating current signal being applied to said filter, and said filter passing at least one frequency component of said alternating current signal; and means for maintaining said transistor non-conductive when the amplitude of said alterating current signal is below a predetermined level, said means comprising a rectifying device for converting the alternating current signal output from said filter to a direct voltage having a magnitude proportional to said signal, and a monostable switch responsive to said direct voltage connected directly to said control electrode, said switch in one state providing an output voltage of a polarity and magnitude sufficient to maintain said device non-conductive to said alternating current signals when said direct voltage is below a predetermined magnitude, and in its other state providing an output voltage of fixed value and having a polarity and magnitude sufficient to maintain said device conductive at a linear point in its operating range, said monostable switch comprising a first transistor having a first collector, base and emitter, a second transistor having a second collector, base and emitter, first and second voltage supply leads having a voltage difference therebetween, a first resistance connected between said first voltage supply lead and said first collector, a second resistance connected between said first emitter and said second voltage supply lead, a first voltage divider for said first base, said first voltage divider being connected between said voltage supply leads and arranged to maintain said transistor normally conductive, a third load resistance connected between said first voltage supply lead and said second collector, said second resistance being connected between said second emitter and said second voltage supply lead, a second voltage divider for said second base connected between said first collector and said second voltage supply lead, said second voltage divider arranged to maintain said second transistor normally non-conductive; and a direct connection between said second collector and the said current control electrode.

2. The combination according to claim 1 wherein the transistors included in said monostable switch each have a driving point impedance characteristic including two stable regions joined by an unstable region, operation in said stable regions occurring selectively as a function of base bias voltage for different base bias voltages.

3. The combination comprising: a source of alternating current signals; a gating circuit coupled to said source for passing said alternating current signals, said gating circuit comprising an electron flow controlling device having an emitting electrode, a collecting electrode, and a current flow control electrode; a two-terminal direct current source of biasing potential; a resistive load for said signal connected to said collecting electrode, said resistive load and said collecting and emitting electrodes being connected in series between said terminals; an electronic filter having a pass-band characteristic having at least one skirt of predetermined finite slope, said alternating current signal being applied to said filter, and said filter passing at least one frequency component of said alternating current signal; and means for maintaining said electron flow controlling device non-conductive when the amplitude of said alternating current signal is below a predetermined level, said means comprising a rectifying device for converting the alternating current signal output from said filter to a direct voltage having a magnitude proportional to said signal, and a monostable switch responsive to said direct voltage connected directly to said control electrode, said switch in one state providing an output voltage of a polarity and magnitude sufficient to maintain said device non-conductive to said alternating current signals when said direct voltage is below a predetermined magnitude, and in its other state providing an output voltage of fixed value and having a polarity and magnitude sufficient to maintain said device conductive at a linear point in its operating range, said rectifying device comprising a semiconductor diode connected in a bridge network, said bridge network including first and second resistors connected in series between the two terminals of said direct current source, second and third resistors connected in series between said two terminals, said semiconductor diode being connected between the junction of said first and second resistors and the junction between said third and fourth resistors, and a storage capacitor being connected across said fourth resistor, said alternating current signal output from said filter being applied across said second resistor, said monostable switch being responsive to the direct voltage derived from said fourth resistor.

4. A threshold circuit including in cascade, an input signal terminal for amplitude varying signals, a detector for said signals and responsive to said signals to provide D.C. control signals, a monostable switch responsive to said D.C. control signals, said monostable switch being switched from a first state to a second state in response to D.C. control signals at least equal to a first threshold level and from said second state to said first state in response to D.C. control signals at a second threshold level substantially lower than said first threshold level, a normally closed gate responsive to said monostable switch to open said gate only in one state of said monostable switch, and a signal path between said input terminal and said gate subsisting in shunt to said detector and said monostable switch, said detector comprising a semiconductor diode connected in a bridge network, said bridge network including first and second resistors connected in series between the two terminals of said direct current source, second and third resistors connected in series between said two terminals, said semiconductor diode being connected between the junction of said first and second resistors and the junction between said third and fourth resistors, and a storage capacitor being connected across said fourth resistor, said alternating current signal output from said filter being applied across said second resistor, said monostable switch being responsive to the direct voltage derived from said fourth resistor.

5. A threshold circuit including in cascade, an input signal terminal for amplitude varying signals, a detector for said signals and responsive to said signals to provide D.C. control signals, a filter interposed between said input signal terminal and said detector, a monostable switch responsive to said D.C. control signals, said monostable switch being switched from a first state to a second state in response to D..C. control signals at least equal to a first threshold level and from said second state to said first state in response to D.C. control signals at a second threshold level substantially lower than said first threshold level, a normally closed gate responsive to said monostable switch to open said gate only in one state of said monostable switch, and a signal path between said input terminal and said gate subsisting in shunt to said detector and said monostable switch, said detector comprising a semiconductor diode connected in a bridge network, said bridge network including first and second resistors connected in series between the two terminals of said direct current source, second and third resistors connected in series between said two terminals, said semiconductor diode being connected between the junction of said first and second resistors and the junction between said third and fourth resistors, and a storage capacitor being connected across said fourth resistor, said alternating current signal output from said filter being applied across said second resistor, said monostable switch being responsive to the direct voltage derived from said fourth resistor.

References Cited by the Examiner

UNITED STATES PATENTS

| | | | |
|---|---|---|---|
| 2,809,289 | 10/57 | Harris et al. | 250—20.52 |
| 2,817,771 | 12/57 | Barnothy | 307—88.5 |
| 2,833,938 | 5/58 | Pinckaers | 307—88.5 |
| 2,866,848 | 12/58 | Fogel | 250—20.52 |
| 2,926,241 | 2/60 | Goldman | 250—20.52 |
| 2,943,316 | 6/60 | Covely | 250—20.52 |
| 3,072,801 | 1/63 | Dahlberg | 307—88.5 |

JOHN W. HUCKERT, *Primary Examiner.*

GEORGE N. WESTBY, *Examiner.*